United States Patent [19]

Zajac et al.

[11] Patent Number: 4,801,241
[45] Date of Patent: Jan. 31, 1989

[54] MODULAR ARTICLE PROCESSING MACHINE AND METHOD OF ARTICLE HANDLING THEREIN

[75] Inventors: John Zajac, San Jose; Ninko T. Mirkovich, Novato; Thomas M. Rathmann, Rohnert Park; Roger B. Lachenbruch, Petaluma, all of Calif.

[73] Assignee: Tegal Corporation, Petaluma, Calif.

[21] Appl. No.: 588,029

[22] Filed: Mar. 9, 1984

[51] Int. Cl.$^4$ ............................................. C23C 14/00
[52] U.S. Cl. ..................................... 414/786; 414/217
[58] Field of Search ............... 414/217, 222, 225, 287, 414/786; 118/50, 500, 719, 728, 729, 733; 198/339, 341, 345, 774

[56] References Cited

U.S. PATENT DOCUMENTS

| | | | |
|---|---|---|---|
| 3,973,665 | 8/1976 | Giammanco | 118/733 X |
| 4,293,249 | 10/1981 | Whelan | 414/217 X |
| 4,402,613 | 9/1963 | Daly et al. | 414/416 X |
| 4,498,832 | 2/1985 | Corville | 414/217 |
| 4,500,407 | 2/1985 | Boys et al. | 414/217 X |

OTHER PUBLICATIONS

Bidirectional Air Conveyor–Noteware et al., IBM Technical Disclosure Bulletin, vol. 17, No. 8, Jan. 1975.

Primary Examiner—Robert J. Spar
Assistant Examiner—David A. Bucci
Attorney, Agent, or Firm—Paul F. Wille

[57] ABSTRACT

Automated article processing, particularly semiconductor wafer processing, is accomplished in a modular article processing machine. The design of the machine allows easy reconfiguration between single and multiple processing station systems. Articles are handled according to a method which easily accommodates the various configurations of the machine and which provides efficient throughput. The machine includes a number of electromechanical and pneumatic systems under the control of at least one microprocessor. Machine state knowledge necessary for startup in the midst of operation, such as following a power interruption, is provided by a mechanical counter indexed at the completion of each stage of operation by the microprocessor controller.

2 Claims, 11 Drawing Sheets

MODULAR ARTICLE PROCESSING MACHINE AND METHOD OF ARTICLE HANDLING THEREIN

FIELD OF THE INVENTION

The present invention relates, in general, to automated article processing machines. More particularly, the invention relates to a modular article processing machine and method of article handling therein which is particularly suited to wafer processing in semiconductor device manufacture.

BACKGROUND OF THE INVENTION

The manufacture of semiconductor devices is tending toward greater degrees of automation in the search for higher yield and throughput. One manifestation of this tendency is the use of cassette-to-cassette wafer processing machines. Such a machine accepts an input cassette containing a plurality of wafers, processes those wafers in an automated fashion and returns the wafers to the same or another cassette to be removed from the machine. Many of the process steps used in semiconductor manufacture have been incorporated into such machines. Plasma processes, such as plasma etching and reactive ion etching, are prime examples.

A shortcoming of present automated wafer processing machines is their relative inflexibility to be modified to meet the changing needs of a production line. For instance, a typical cassette-to-cassette plasma etcher having a single plasma reactor cannot be easily modified to add a second plasma reactor. This requires the purchase of an entirely new machine to gain the throughput advantages of a dual head plasma etcher. Improvements in both the hardware of wafer processing machines and in the methods of wafer handling therein are necessary to overcome this inflexibility.

Typical automated wafer processing machines incorporate complex electromechanical and pneumatic systems under the control of one or more microprocessors. In such systems it is necessary that the controllers have knowledge of the present state of each of the moveable parts of the system. This knowledge is particularly necessary when bringing the machine up at some state in the middle of the process. An example of this is the restoration of power following an interruption in the power supply in the midst of operation. Typical prior art systems employ a complex system of sensors distributed throughout the machine to provide the required machine state knowledge. The complexity of this system itself substantially contributes to the failure rates and time to repair of the entire machine.

SUMMARY OF THE INVENTION

Accordingly, it is an object of the present invention to provide an improved, modular, article processing machine.

A further object of the present invention is to provide an improved method of article handling in a modular processing machine.

Yet a further object of the present invention is to provide an improved machine state knowledge apparatus in a modular processing machine.

A particular embodiment of the present invention comprises a modular, cassette-to-cassette plasma processing machine. The machine is modular in the sense that it can be configured as a one, two or three head system. That is, it can utilize one, two or three plasma reactors. Unprocessed wafers are removed from a multi-wafer cassette and passed through a multi-wafer vacuum load lock prior to entry into the vacuum transport portion of the machine. The vacuum transport portion of the machine transfers wafers in an extremely efficient manner from the input load lock to the processing head or heads. The lower electrodes of the plasma reactors are an integral part of the vacuum transport system, a feature which contributes substantially to the ease of reconfiguration of the machine. In a single head machine, wafers are returned to the single load lock and then back to the original multi-wafer cassette once processing is complete. In a multi-head system, processed wafers are placed in an output load lock and passed therefrom to an output multi-wafer cassette. In the multi-head configuration the lower electrodes of the plasma reactors, also referred to as chucks, are used as staging platforms in the wafer transport scheme. Wafers are processed simultaneously through the complete process run in the several plasma reactors. The chucks are then lowered and the vacuum transport system moves unprocessed wafers onto the chucks and the processed wafers into the output load lock in an extremely efficient manner.

While the various electromechanical and pneumatic systems which comprise the wafer processing machine are not mechanically coupled to one another, the machine state knowledge is provided by means of a mechanical counter. The main microprocessor which controls the movements of each of the mechanical systems increments the counter at the completion of each movement step. Therefore, the counter uniquely identifies the state of the machine as of the most recently completed movement step. When powering up the machine in the midst of the processing cycle the machine state knowledge stored in the mechanical counter is provided to the main microprocessor either by operator input or by encoding the state of the counter. This extremely simple solution provides the necessary machine state knowledge required for midstream startup without the complexity of sensor systems.

These and other objects and advantages of the present invention will be apparent to one skilled in the art from the detailed description below taken together with the drawings.

DETAILED DESCRIPTION OF THE INVENTION

Figure 1:
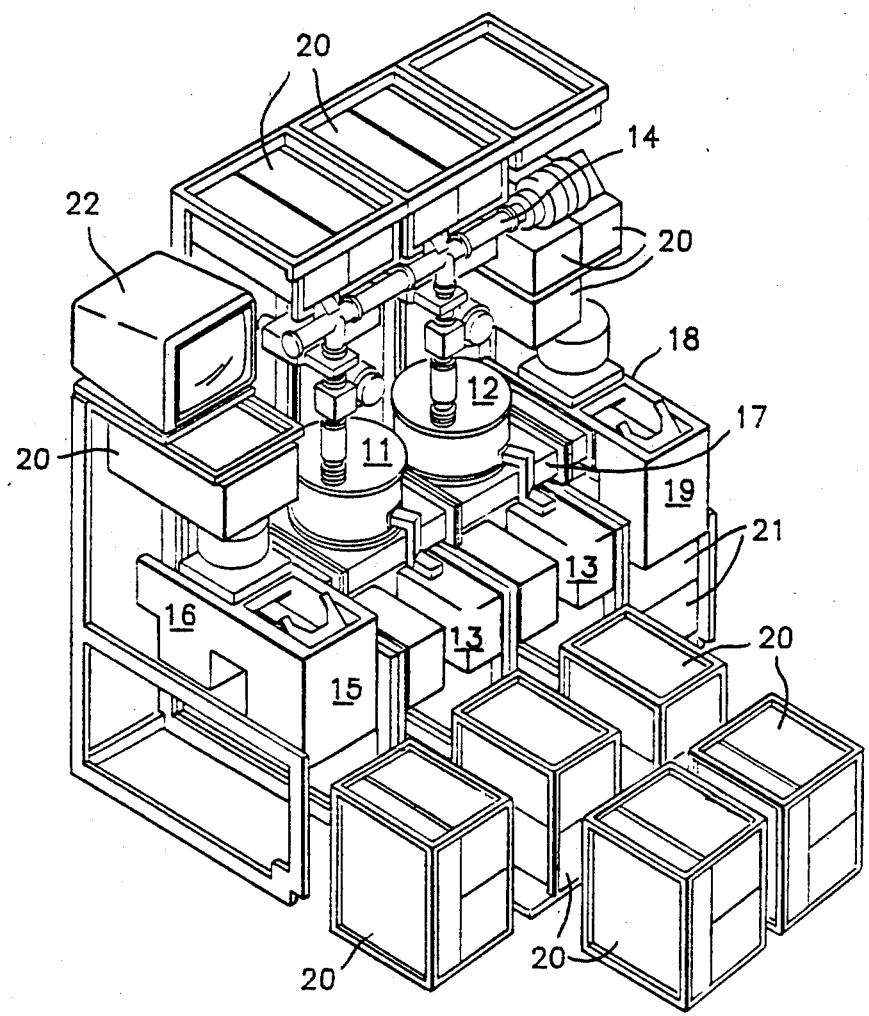
FIG. 1 is a perspective view of a modular wafer processing machine.

The manufacture of semiconductor devices is normally carried out at the wafer level. That is, disk-like wafers of semiconductor material comprising a relatively large number of individual devices proceed as a whole through the various manufacturing steps before being separated into individual die which each contain a single device, such as a microprocessor. The need for higher yield manufacturing processes leads to more automated wafer processing machines which can process a larger number of wafers per hour and to machines which process those wafers in a cleaner environment. FIG. 1 is a detailed perspective view of such a wafer processing machine which embodies a number of improvements over the prior art. The particular machine shown in FIG. 1 is a two-head plasma etching apparatus. That is, the machine has two plasma processing stations. The actual wafer processing takes place in first and second plasma reactors 11 and 12. Reactors 11 and 12 are supplied with RF power by RF power supplies 13 and are evacuated by means of vacuum manifold 14. A further system which is not seen in this view provides reactive gases to reactors 11 and 12. Wafers to be processed are loaded into the machine by means of a multi-wafer cassette which is loaded onto elevator 15. From there the wafers are transferred to an internal multi-wafer cassette in vacuum load lock 16. A vacuum transport system 17 moves wafers from load lock 16 into reactors 11 and 12 for processing. When processing is complete, vacuum transport system 17 moves wafers to a second load lock 18 and they are finally removed and placed into a multi-wafer cassette on elevator 19. The remainder of the wafer processing machine comprises a plurality of electronic modules 20 and controllers 21 for monitoring and modulating the flow of the reactive gases. In addition, a display 22 is typically provided so that an operator can monitor the overall state of the machine. As now expected in the art, a complex machine such as this is generally controlled by one or more microprocessors, rather than fixed logic, which easily accommodates display 22.

As is described in detail with reference to each of the figures below, the overall design philosophy of the wafer processing machine shown in FIG. 1 is modularity. For instance, the machine can be configured with one, two, or more plasma reactors without significantly altering the overall layout or wafer transport method. In addition, elevators 15 and 19 and the associated wafer transfer apparatus are designed so that both the input and output ends of the machine may have one or two elevators. Various other aspects and improvements of the wafer processing machine shown in FIG. 1 will be apparent from the remainder of the drawings and description.

Figure 2:
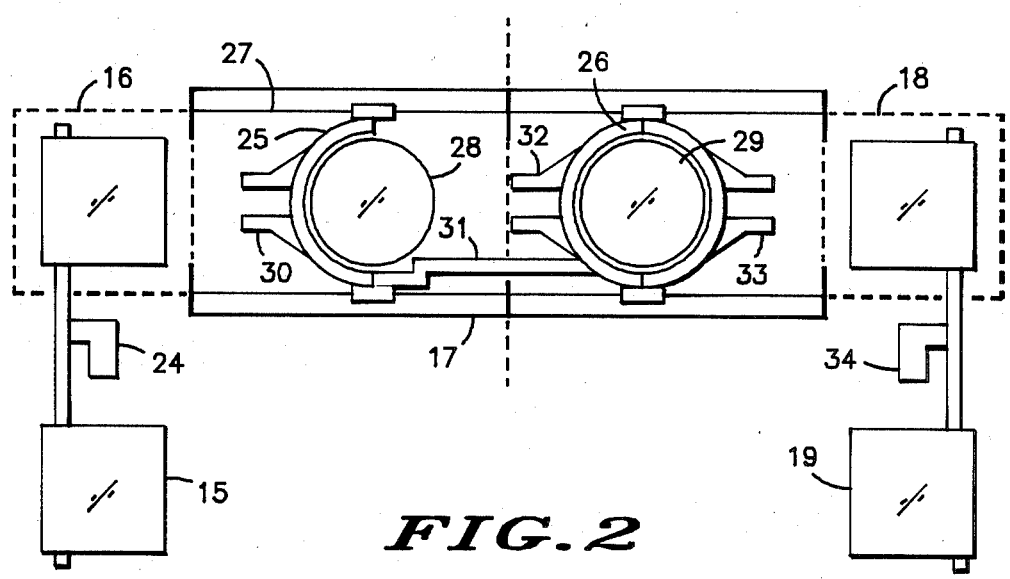
FIG. 2 is a simplified plan view of a wafer transport system for use in a machine such as shown in FIG. 1.

Referring now to FIG. 2, the overall wafer transport system is shown in a simplified plan view. A multi-wafer cassette is entered into the system on elevator 15. Multi-wafer cassettes are familiar in the art and are typically closed on three sides and open on the fourth. Wafers are removed and replaced via the open side and are supported on the three closed sides. A spatula 24 removes individual wafers from the cassette on elevator 15 and places them in an internal cassette in load lock 16. As is familiar in the art, spatula 24 moves only horizntally and wafers are placed on and removed from spatula 24 by vertical movements of elevator 15 and the internal cassette. For instance, the internal cassette would be positioned vertically so that spatula 24 carrying a wafer will move into the appropriate wafer slot. Once spatula 24 is so positioned, the internal cassette is indexed upwardly a small distance to lift the wafer off spatula 24. Spatula 24 is then removed, leaving the wafer in the internal cassette. Once the internal cassette is loaded, load lock apparatus 16 is cycled. That is, load lock 16 is closed and sealed, the atmosphere is removed therefrom and then load lock 16 is opened to connection with vacuum transport system 17.

Vacuum transport system 17 comprises first and second shuttle plates 25 and 26, which move in a horizontal direction on guide rails 27, and chucks 28 and 29 which serve both in the wafer handling scheme and as the lower electrode in plasma reactors 11 and 12, respectively. In operation, shuttle plate 25 is moved to its extreme left and a wafer from the internal cassette in load lock 16 is placed on tines 30. Because of mechanical coupler arm 31, shuttle plate 26 simultaneously moves to its extreme left and any wafer which had been on chuck 28 is placed on tines 32. Similarly, any wafer which had been on chuck 29 is placed on tines 33. The next phase of operation involves moving shuttle plates 25 and 26 to their extreme right, whereby a wafer on tines 30 is placed on chuck 28, a wafer on tines 32 is placed on chuck 29 and a wafer on tines 33 is placed in the outgoing load lock 18. Next, shuttle plates 25 and 26 are moved to the positions shown in FIG. 2. Next, chucks 28 and 29 are raised to carry their respective wafers into the plasma chambers and the plasma process is performed. Finally, chucks 28 and 29 are lowered and vacuum transport system 17 moves new wafers into position to be processed. When all of the wafers have been transferred to outgoing load lock 18, that load lock is cycled and spatula 34 removes the wafers to the multi-wafer cassette on outgoing elevator 19.

If the wafer processing machine is configured as a single head machine, the apparatus of FIG. 2 will be precisely the same except that everything to the right of dotted line 35 and coupling arm 31 is removed. In such a system the wafer transport method is relatively simple. Once wafers are in load lock 16, they are serially removed by shuttle plate 25, processed and returned to load lock 16. Thus, in this configuration, load lock 16 and elevator 15 serve both input and output functions.

In the two-head configuration shown in FIG. 2, the rightmost shuttle plate 26 carries two sets of tines, 32 and 33, while the leftmost shuttle plate 25 carries only a single set of tines, 30. This relationship can be reversed without affecting the overall transport scheme.

Figure 3A:
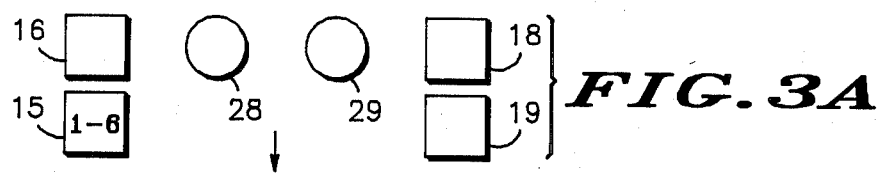
FIGS. 3A-3H are a series of schematic diagrams illustrating a method of wafer transport in a machine such as shown in FIGS. 1 and 2.
Figure 3B:
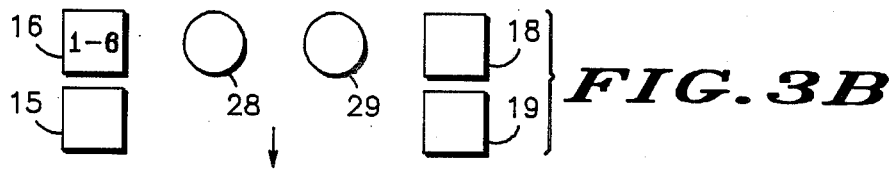
Figure 3C:
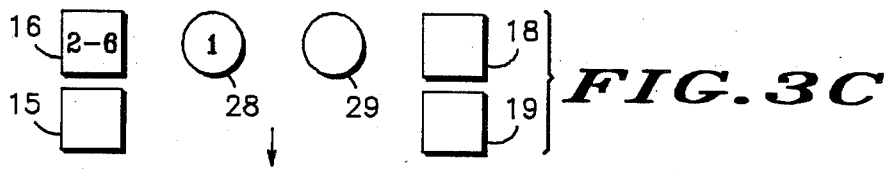
Figure 3D:
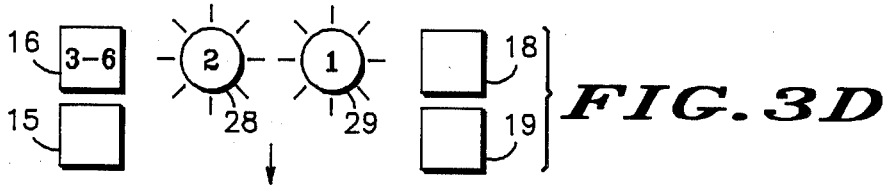
Figure 3E:
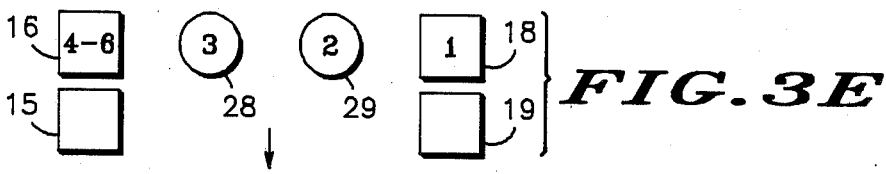
Figure 3F:
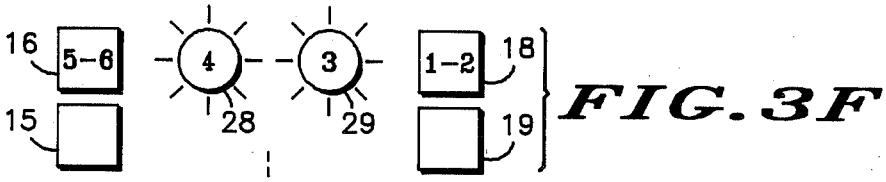
Figure 3G:
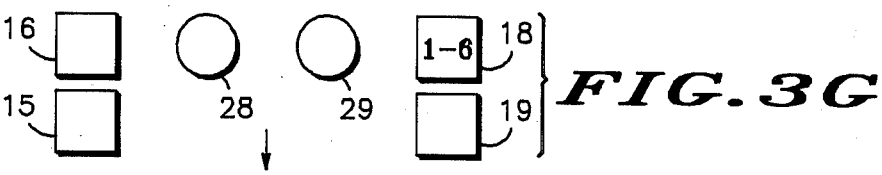
Figure 3H:
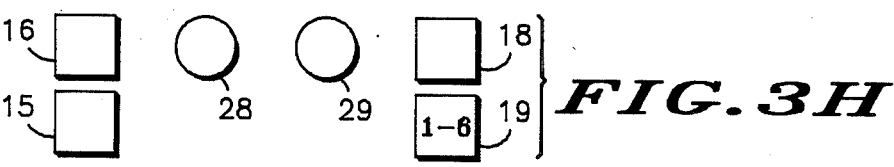

FIGS. 3A–3H schematically illustrate the wafer transport method used in the two-head configuration shown in FIGS. 1 and 2. Initially, six wafers to be processed are in a multi-wafer cassette on elevator 15 (FIG. 3A). Following the wafer transfer and load lock cycle steps, wafers 1 through 6 are in the internal cassette in load lock 16 and are accessible by the vacuum transport system (FIG. 3B). One cycle of the vacuum transport system; i.e.: a full left movement followed by a full right movement; moves wafer number 1 onto chuck 28 and leaves wafers 2 through 6 in load lock 16 (FIG. 3C). One more cycle of the vacuum transport system moves wafer 1 onto chuck 29 and wafer 2 onto chuck 28. At this point, chucks 28 and 29 are raised to close the plasma reactors and the plasma process is performed (FIG. 3D). Next, chucks 28 and 29 are lowered and the vacuum transport system is put through one cycle. This results in wafer 1 being transferred to load lock 18, wafer 2 being transferred to chuck 29 and wafer 3 being transferred to chuck 28, leaving wafers 4 through 6 in load lock 16 (FIG. 3E). One more cycle of the vacuum transport system places wafer 2 into load lock 18, wafer 3 onto chuck 29 and wafer 4 onto chuck 28. Once again, chucks 28 and 29 are raised and the plasma process is performed (FIG. 3F). In steps not shown in FIG. 3, wafers 3 and 4 are moved into load lock 18, wafers 5 and 6 are moved onto chucks 28 and 29 and processed and are subsequently moved into load lock 18. This leaves all of the six wafers in load lock 18 (FIG. 3G), which is cycled prior to removing wafers 1 through 6 to output cassette 19 (FIG. 3H).

The described wafer transport scheme lends itself particularly well to a modular wafer processing machine. The ability to use each of the chucks as a wafer holding platform during the transfer operation allows the use of a multi-head, in line system without the added complexity of partial wafer processing in each of the chambers. The extension of this scheme to a three-head wafer processing machine is straightforward. The primary difference being that three cycles of the vacuum transport system will intervene between each processing step.

Figure 4:
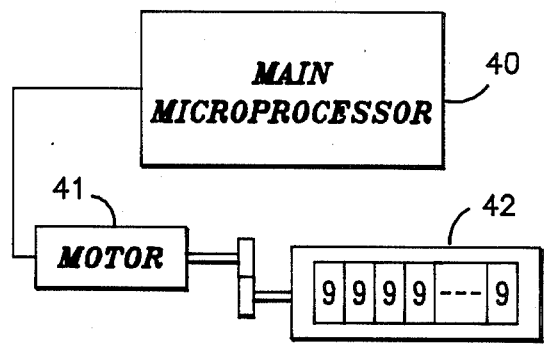
FIG. 4 is a schematic diagram of a machine state counter for use in a machine such as shown in FIG. 1.

In any complex electromechanical machine such as is described herein, the difficulty of recovering from a power failure or similar accident at some point in the midst of the operation of the machine may arise. That is, the microprocessor which controls the function of each of the transport motors, the pneumatic valves and other devices in the system must know the state of each of those devices when it is restarted in the middle of processing. The problem is complicated by the fact that the various electromechanical, pneumatic and other systems are not mechanically interconnected; i.e. one cannot simply advance to the next machine state. FIG. 4 is a schematic diagram of a method for providing the necessary information. Each time main microprocessor 40 completes an operation, such as moving an elevator or raising a chuck, a signal is sent to motor 41 which increments a counter 42 by one. Thus, the number displayed by counter 42 uniquely identifies the state the machine was in when it completed the last step prior to the malfunction. When power is restored, a machine operator keys in the number displayed on counter 42, which is then used by main microprocessor 40 to determine its state and to continue processing. This deceptively simple solution to the problem of determining the machine's state is much superior to a system requiring a sensor or sensors for each moveable component. It is also possible, of course, to make counter 42 machine-readable so that no operator intervention is required to identify the machine's state at power up.

Figure 5:
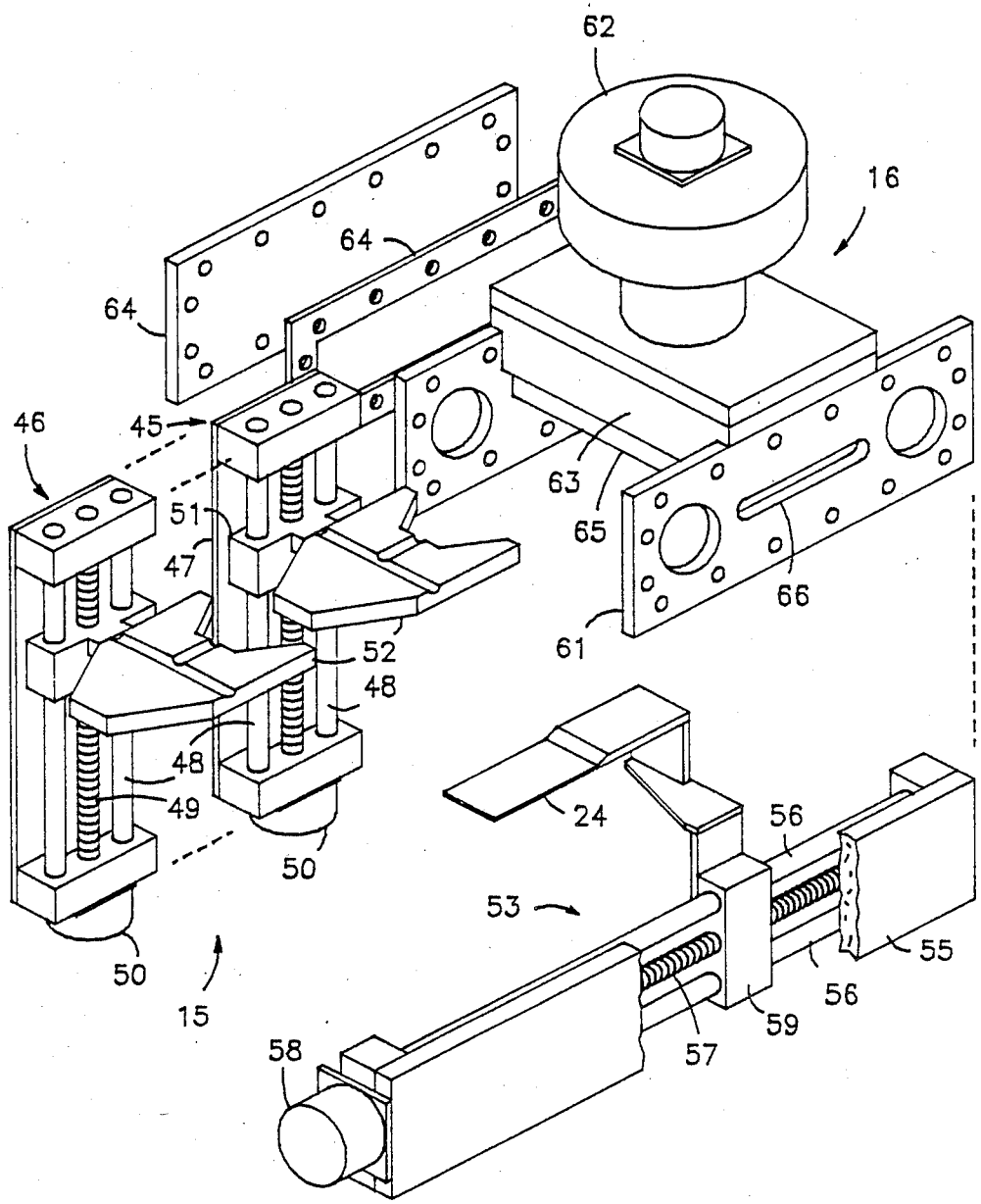
FIG. 5 is an exploded perspective view of an elevator and load lock system for use in a machine such as shown in FIG. 1.

Referring now to FIG. 5, the elevator-load lock portion of the apparatus is described with reference to an exploded perspective view thereof. In automated wafer processing machines, this portion of the machine is typically referred to as a sender/receiver unit. The configuration shown in FIG. 5 has two elevators 45 and 46, respectively. Elevators 45 and 46 are shown in a simplified version in FIG. 5 and are shown in greater detail in FIGS. 6A and 6B. In general, each elevator comprises a frame 47, a pair of guide rails 48, a lead screw 49, a motor 50 coupled to lead screw 49, a carrier 51 riding on guide rails 48 and driven by lead screw 49 and a cassette platform 52. Motors 50 are of the type which are capable of rotation in accurately predetermined steps. Thus, the vertical position of cassette platforms 52 can be controlled very precisely. This is necessary to achieve wafer transfer between the multi-wafer cassette and spatula 24. Carrier 51 supports cassette platform 52 in a cantilever fashion so that when elevator 45 is in its fully raised position it does not interfere with spatula apparatus 53. This feature allows the use of multiple elevators arranged front-to-back and served by a single spatula. Although not shown in FIG. 5, cassette platforms 52 include pins, grooves and/or rails to aid in positioning the multi-wafer cassette to insure accurate loading and unloading.

Spatula apparatus 53, which is shown away from its normal position for clarity, comprises a frame 55, a pair of guide rails 56, a lead screw 57, a motor 58 attached to frame 55 and coupled to lead screw 57, a carrier 59 guided by guide rails 56 and driven by lead screw 57 and a spatula 24 attached to carrier 59. The cantilever arrangement between spatula 24 and carrier 59 is such that frame 55 of spatula apparatus 53 mounts on the opposite wall of the machine from frames 47 of elevators 45 and 46. To facilitate the allowance for single or dual elevator configurations, spatula apparatus 55 is made long enough to serve the dual elevator configuration. In the single elevator configuration, spatula apparatus 53 is simply mounted in a more rearward position. Changing from a single to a dual elevator configuration simply involves bolting in the second elevator, moving the spatula apparatus forward and altering the programming of the microprocessor controller.

Load lock apparatus 16 comprises bulkheads 61, a dual motion mechanical feedthrough apparatus 62, a housing 63, sealing plates 64, a lower bell jar 65, an upper bell jar which cannot be seen in this view and an internal passthrough cassette which also is not seen in FIG. 5. A slot 66 in each of the bulkheads 61 provides access between load lock 16 and the vacuum transport system when the upper bell jar is raised. Since vacuum load lock apparatus 16 is designed to function on either the input or the output end of a modular wafer processing machine, sealing plates 64 are used to seal the unused slot 66. A more detailed description of load lock apparatus 16 is given with reference to FIG. 7, below.

In broad outline, the operation of the apparatus of FIG. 5 is as follows. A multi-wafer cassette is placed on each elevator platform 52. One of the elevators, say elevator 45, is lowered to a position in which spatula 24 can be inserted under the first wafer. Also, the upper bell jar is lowered to seal off the vacuum transport system, lower bell jar 65 is lowered and the internal passthrough cassette is lowered. As will be apparent from the discussion below, dual motion feedthrough 62 drives each of these movements. Spatula 24 is inserted under the first wafer in the cassette and elevator 45 is moved down a very small distance to place the wafer on spatula 24. Spatula 24 is then moved rearward to place the wafer in the internal cassette. The internal cassette is then moved up a very small distance to pick up the wafer from spatula 24. This wafer transfer operation is repeated until each of the available slots in the internal passthrough cassette is filled. Next, the internal cassette is raised, as is lower bell jar 65, thus completely sealing load lock apparatus 16, which is pumped down to approximately the same vacuum level as the vacuum transport system. Next, the upper bell jar is raised to provide the vacuum transport system with access to the internal cassette. At this point wafer transfer to the processing heads and processing can commence.

Figure 6A:
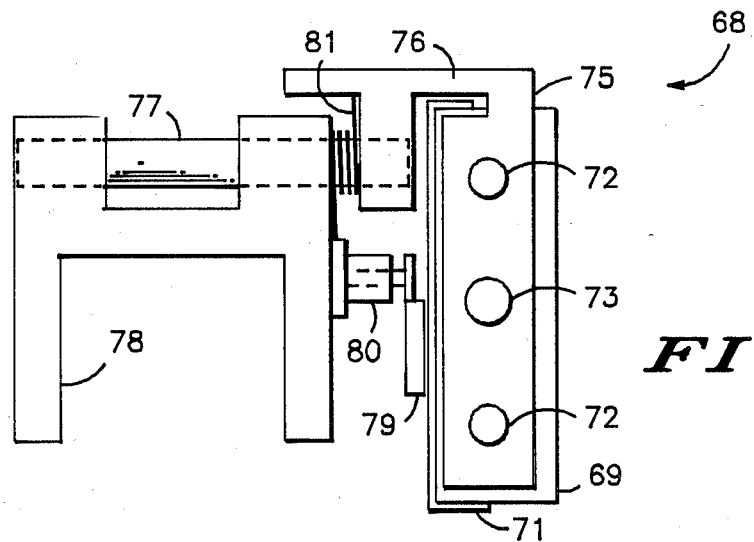
FIGS. 6A and 6B are top and side views, respectively, of a cassette elevator for use in a machine such as shown in FIG. 1.
Figure 6B:
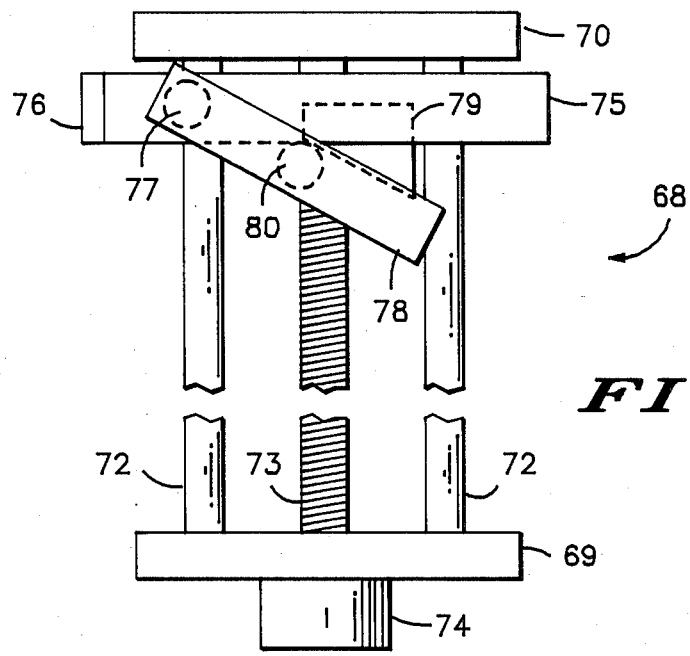

FIGS. 6A and 6B are top and side views, respectively, of a particular elevator apparatus 68. In both FIGS. 6A and 6B, the cassette platform which carries the multi-wafer cassette has been removed to show underlying detail. The frame of elevator apparatus 68 comprises a lower mounting plate 69, an upper mounting plate 70 which is not shown in FIG. 6A, a cover plate 71 which is not shown in FIG. 6B, a pair of guide rails 72 and a lead screw 73. Cover plate 71 extends between lower mounting plate 69 and upper mounting plate 70 and serves to isolate the particle producing mechanism of elevator 68 from the wafers. A motor 74 is mounted on lower mounting plate 69 and coupled to lead screw 73. A carrier plate 75 rides guide rails 72 and is driven by lead screw 73. A cantilevered portion 76 of carrier plate 75 extends around cover plate 71 and provides a mounting point for a pivot pin 77. A platform carrier 78 is pivotally carried on pivot pin 77 at a front edge thereof. That is, the edge of carrier plate 78 at which it is mounted to pivot pin 77 is the edge which faces the load lock apparatus. A cam 79 is mounted on cover plate 71 and a cam follower 80 is mounted on platform carrier 78. Finally, a spring 81 biases carrier plate 78 to a horizontal position.

As carrier plate 75 is moved to its uppermost position by motor 74 and lead screw 73, cam follower 80 contacts cam 79 and forces platform carrier 78 to a rearwardly inclined position. Of course, when carrier plate 75 is in a lower position in which cam follower 80 does not contact cam 79, spring 81 maintains platform carrier 78 in a horizontal position. This automatic tilting feature of elevator 68 significantly reduces the likelihood of wafer breakage. When multi-wafer cassettes are being loaded onto conventional elevators, it is relatively easy to jostle wafers out of the roughly vertical cassette and break them. However, with elevator 68 the cassette platform is in a rearwardly inclined position when the multi-wafer cassette is being loaded, i.e. when elevator 68 is in its uppermost position. Thus, the operator is forced to tilt the multi-wafer cassette backwards, thus insuring that the wafers will not jostle out of the open front side of the cassette. The cassette platform typically includes a backstop to increase the stability of the cassette on the platform in the tilted position. The other major feature of the elevator illustrated in FIGS. 6A and 6B is the cantilever relationship between the drive mechanism and the elevator platform. As discussed above, this feature allows the spatula apparatus to pass under the first elevator in the dual elevator arrangement.

Figure 7:
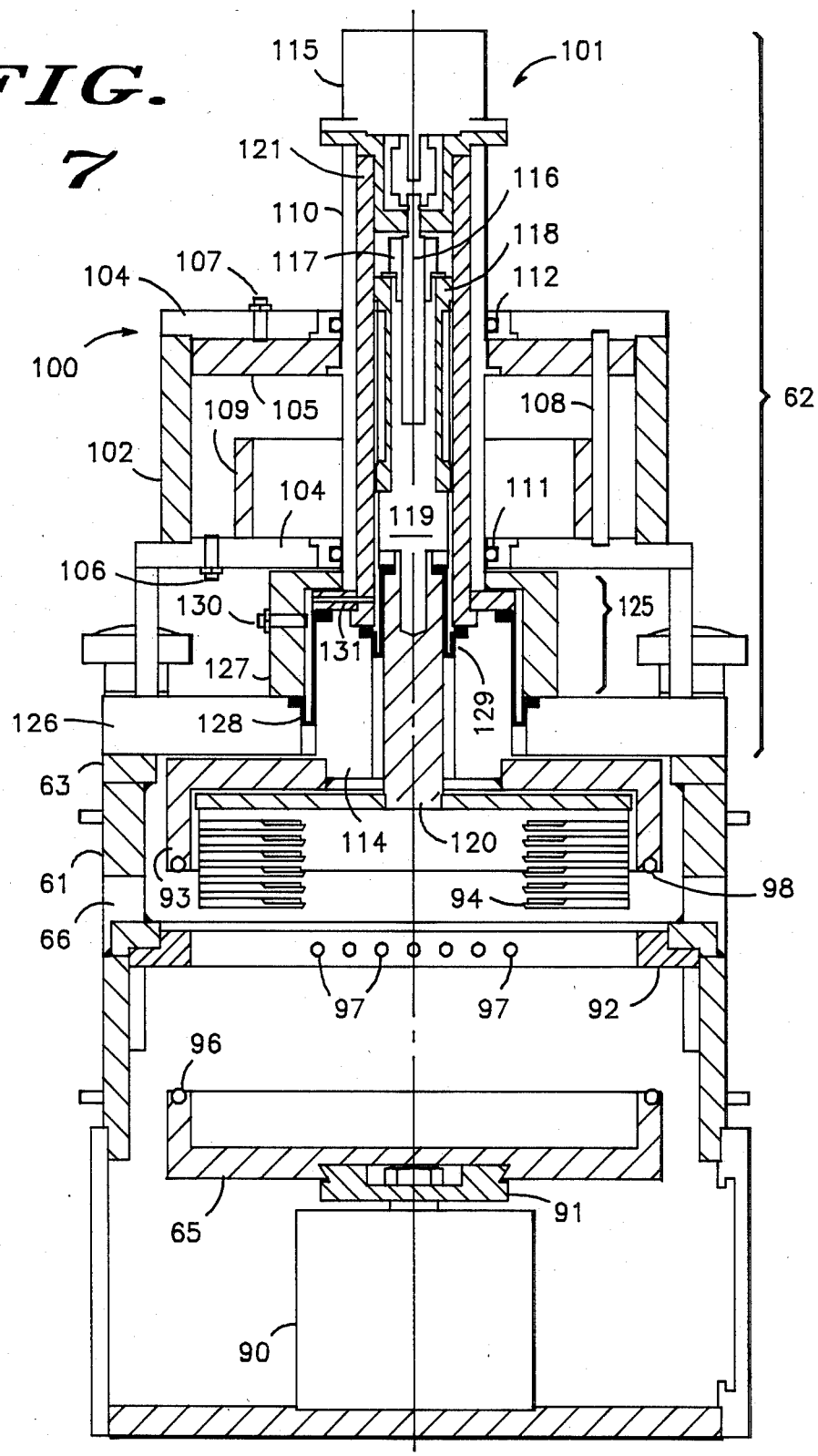
FIG. 7 is a cross-sectional view of a load lock apparatus for use in a machine such as shown in FIG. 1.

FIG. 7 is a detailed cross sectional view of load lock apparatus 16 as shown in FIG. 5. As discussed with reference to FIG. 5, bulkheads 61 with slots 66 provide mounting and access to the vacuum transport system. Dual motion mechanical feedthrough 62 actuates the internal components of the load lock apparatus while providing a vacuum seal. The load lock itself comprises lower bell jar 65, fixed sealing plate 92 and upper bell jar 93. Lower bell jar 65 is moved from its lowered position as shown to a raised position in which it seals to sealing plate 92 by actuator 90. Actuator 90 may be, for instance, a pneumatic cylinder and piston. Mounting device 91, which couples actuator 90 to lower bell jar 65 is arranged so that lower bell jar 65 can slide in the direction perpendicular to the plane of FIG. 7. This feature allows the easy removal of lower bell jar 65 to remove pieces of broken wafers. An O-ring 96 provides the necessary seal between lower bell jar 65 and sealing plate 92.

Sealing plate 92, which may be advantageously made of stainless steel to provide an adequate seal over a long lifetime, has a generally rectangular aperture to allow the passage of passthrough cassette 94. A plurality of holes 97 are arranged along the inner perimeter of this aperture. Holes 97 are coupled to a vacuum system so that the load lock can be pumped down when both lower bell jar 65 and upper bell jar 93 are sealed to sealing plate 92.

Upper bell jar 93, which is shown in its raised position, is substantially similar to lower bell jar 65. Upper bell jar 93 includes an O-ring 98 for providing a seal to sealing plate 92.

Internal passthrough cassette 94, which is discussed in more detail with reference to FIGS. 8A and 8B below, serves to receive a number of unprocessed wafers from the cassette on the elevator and to hold them until they are retrieved by the vacuum transport system. On the output end of the wafer processing machine, passthrough cassette 94 serves to receive processed wafers from the vacuum transport system and hold them until they are transferred to the output cassette.

Both upper bell jar 93 and passthrough cassette 94 are moved in a vertical direction by dual motion feedthrough apparatus 62. As is apparent, the positions of lower bell jar 65 and upper bell jar 93 shown in FIG. 7 would never occur simultaneously in the normal operation of the load lock apparatus. When upper bell jar 93 is in the raised position shown, lower bell jar 65 is sealed against sealing plate 92. This maintains the integrity of the vacuum in the vacuum transport system and allows access through slot 66 to wafers in passthrough cassette 94. On the other hand, when lower bell jar 65 is in its lowered position, as shown, upper bell jar 93 is sealed against sealing plate 92 and passthrough cassette 94 is also lowered to a position below sealing plate 92. In this position, upper bell jar 93 maintains the integrity of the vacuum in the vacuum transport system and passthrough cassette 94 may be loaded and/or unloaded by the spatula. The third normal position of the load lock is with both upper bell jar 93 and lower bell jar 65 sealed to sealing plate 92. In this position, the load lock may be cycled to or from the level of the vacuum in the vacuum transport system and atmospheric pressure. As was discussed above, holes 97 in sealing plate 92 are coupled to the systems which perform this cycle. As will be apparent to one skilled in the art, it is also possible to perform some manufacturing processes in the load lock when it is in the fully closed state. In other words, holes 97 may be used to vent reactive gases into the closed load lock. Once the desired process is complete, the load lock is evacuated via holes 97. This capability allows more than one process to be run in a single machine, thereby improving overall throughput and reducing costs.

Turning now to dual motion mechanical feedthrough apparatus 62, this is most easily described by referring to an outer actuator 100 and an inner actuator 101. Outer actuator 100 moves upper bell jar 93 between its raised and lowered positions and also carries inner actuator 101. Inner actuator 101 raises and lowers passthrough cassette 94. Therefore, when outer actuator 100 is lowering upper bell jar 93, the entire inner actuator 101 and passthrough cassette 94 are also being lowered.

Outer actuator 100 is, in essence, a pneumatic cylinder and piston arrangement. A cylinder 102, which has end caps 103 and 104, contains a piston 105. Air inlets 106 and 107 in end caps 103 and 104, respectively, are coupled to a pneumatic control system which provides the differential pressure across piston 105 necessary to move it. In addition, a guide pin 108 which is affixed in end caps 103 and 104 and on which piston 105 slides, serves to avoid misalignment between piston 105 and cylinder 102. A stop 109 mounted on end cap 103 serves to restrict the motion of piston 105 in the downward direction. An outer sleeve 110 is affixed to piston 105 and is sealed where it passes through end caps 103 and 104 by O-rings 111 and 112, respectively. Outer sleeve 110 is mechanically coupled through block 113 and collar 114 to upper bell jar 93. Thus, when the air pressure at air inlet 107 is greater than that at air inlet 106, piston 105 moves downward carrying outer sleeve 110 and upper bell jar 93. Similarly, when the pressure at air inlet 106 is greater than that at air inlet 107, piston 105 moves upward carrying outer sleeve 110 and upper bell jar 93. Since inner actuator 101 is carried within outer sleeve 110, its motion also follows that of piston 105.

Inner actuator 101 comprises a motor 115, a lead screw 116, a nut 117, and sliders 118, 119 and 120. Motor 115 turns lead screw 116 which imparts a linear motion to nut 117. Nut 117 is mechanically coupled to slider 118 which, in turn, is coupled to sliders 119 and 120. Therefore, rotary motion of lead screw 116 is translated into linear motion of sliders 118, 119 and 120. Slider 120 is mechanically coupled to passthrough cassette 94. Sliders 118, 119 and 120 slide within an inner sleeve 121 which is carried within outer sleeve 110. Inner sleeve 121 moves with outer sleeve 110. The arrangement described allows motor 115 to precisely position passthrough cassette 94 as is required for the transfer of wafers.

While outer actuator 100 and inner actuator 101 impart the necessary motions to upper bell jar 93 and passthrough cassette 94, the required vacuum seal is provided by sealing apparatus 125. Sealing apparatus 125 primarily comprises lower plate 126, collar 127 and diaphrams 128 and 129. As is apparent, lower plate 126 is sealed via housing 63 and bulkheads 61 to the vacuum transport system. Collar 127 is sealed at one end to lower plate 126 and at the other to outer sleeve 110. Diaphram 128 is captured at its outer edge between lower plate 126 and collar 127. At its inner edge it is captured between block 113 and collar 114. Thus, diaphram 128 provides a vacuum seal for the apparatus which moves upper bell jar 93. Diaphram 129 is captured at its outer edge between collar 114 and inner sleeve 121. At its inner edge it is captured between slider 119 and slider 120. Thus, diaphram 129 provides a vacuum seal for the apparatus which moves passthrough cassette 94. An air inlet 130 and a bleed hole 131 are used to provide a slight positive pressure on the upper sides of diaphrams 128 and 129 so as to maintain their shapes.

Figure 8A:
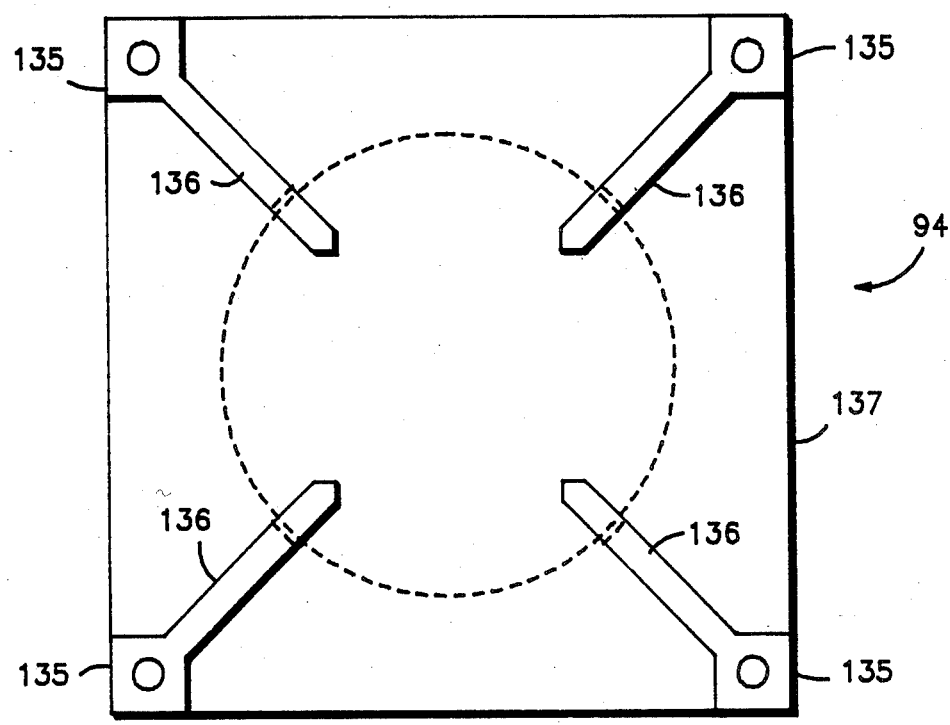
FIGS. 8A and 8B are top and side views respectively of a pass through cassette for use in a load lock apparatus such as shown in FIG. 7.
Figure 8B:
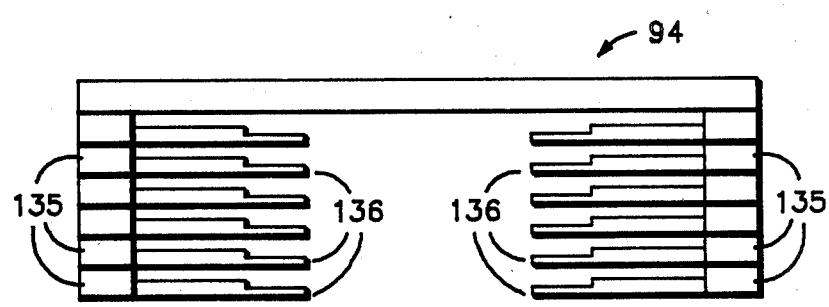

FIGS. 8A and 8B are bottom and side views, respectively, of passthrough cassette 94. The primary feature of passthrough cassette 94 which distinguishes it from previous wafer cassettes is that it must be accessible to wafer transport mechanisms moving in perpendicular directions. That is, the spatula which transfers wafers from the cassette on the elevator to passthrough cassette 94 operates in one direction and the vacuum transport system operates in a substantially perpendicular direction. This requires that wafers be supported only from the four corners of passthrough cassette 94. To this end, each wafer carrying stage of cassette 94 comprises four corner posts 135 which each carries an arm 136. Arms 136 extend from corner posts 135 toward the center of cassette 94. Toward the inner end thereof, arms 136 are stepped to preclude gross misalignment of a wafer within cassette 94. Each corner post 135 is coupled to the one above it and finally to top plate 137 by screws or other appropriate means. In this manner, a passthrough cassette 94 can be readily assembled from simple parts to carry as many wafers as is desired by simply adding another layer of posts 135 and arms 136. Of course, the room available in the load lock places an upper limit on the size of cassette 94.

Figure 9:
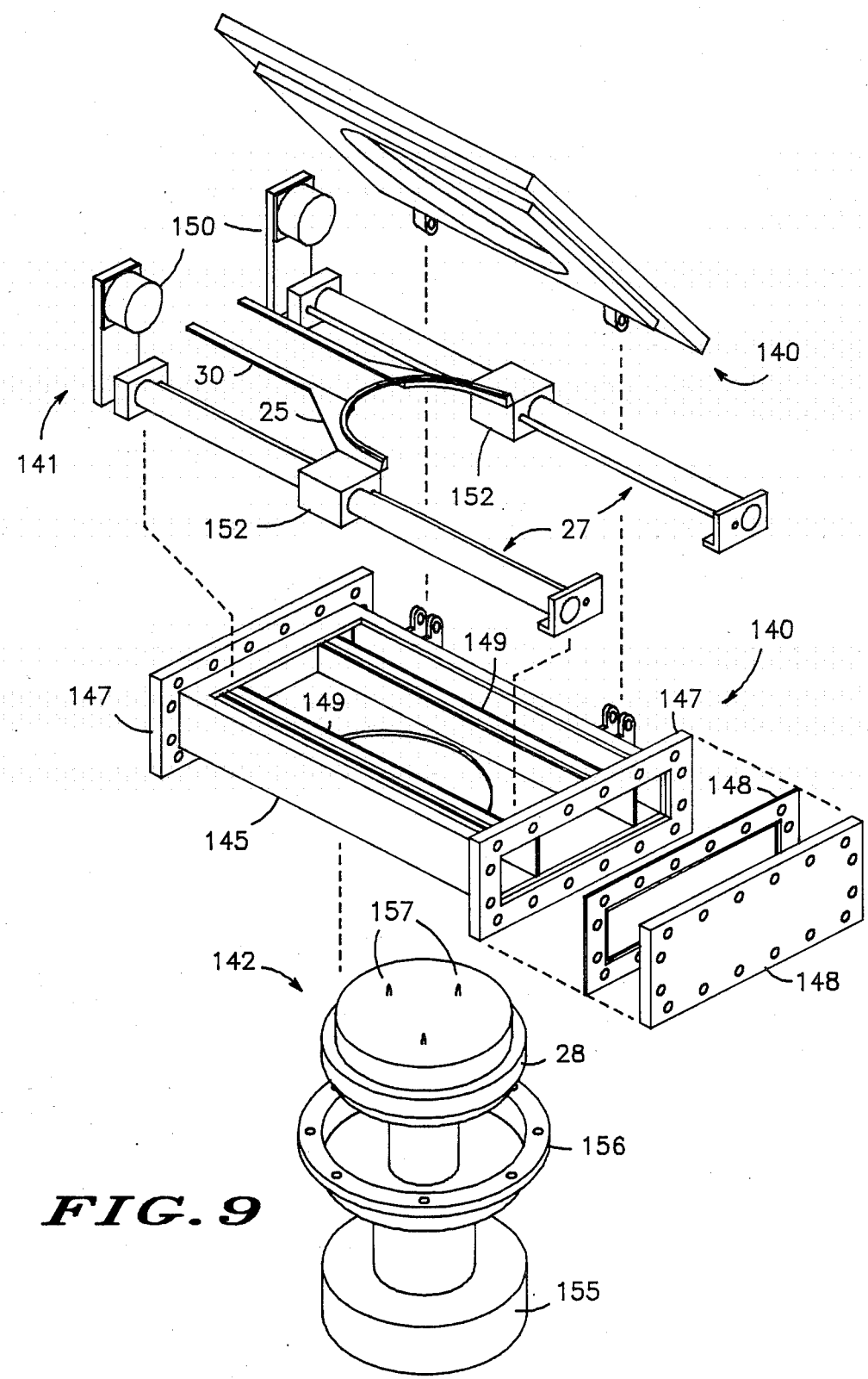
FIG. 9 is an exploded perspective view of a vacuum transport portion of a machine such as shown in FIG. 1.

FIG. 9 is an exploded perspective view of vacuum transport system 17 as it would be configured in a single-head wafer processing machine. Vacuum transport system 17 is comprised of three major components. First, a containment vessel 140 serves as the primary vacuum containment. Second, a magnetically driven transport system 141 serves to transport wafers from passthrough cassette 94 to the chuck. Finally, chuck assembly 142 serves to remove wafers from transport system 141 and to raise them into position to be processed. In addition, a portion of chuck assembly 141 serves as a lower electrode of the plasma processing chamber.

Containment 140 primarily comprises a box 145 and an upper plate 146. Box 145 has bulkheads 147 on either end thereof to provide coupling to the elements of the machine on either end. For instance, in a single head configuration, the leftmost bulkhead 147 would be coupled to bulkhead 61 of load lock 16 and the rightmost bulkhead 147 would be sealed with sealing plates 148. Box 145 also contains baffles 149 which serve to isolate the particle generating portions of transport system 141 from the wafers.

Wafer transport system 141 comprises a pair of drive motors 150 which are typically mechanically coupled to ensure identical motion, a pair of rails 27 which are located within box 145 behind baffles 149, a pair of sliders 152 which ride on rails 27 and a shuttle plate 25 attached to sliders 152. As is apparent from FIG. 9, each of the rails 27 is comprised of a large rail and a small rail. However, the smaller rails serve merely to improve the mechanical rigidity of the system and may be ignored for further purposes. As will be more apparent from the description of FIG. 10 below, motors 150 are mounted outside box 145. Shuttle plate 25 carries a pair of tines 30 which enter passthrough cassette 94 and carry wafers therefrom.

Chuck assembly 142 comprises a dual motion mechanical feedthrough 155, a mounting bell 156 and chuck 28. As will be apparent from the description of FIG. 11 below, dual motion mechanical feedthrough 155 is substantially identical to feedthrough 62 used on load lock 16. This identity substantially reduces manufacturing costs and reduces the number of parts which must be kept in inventory. Mounting bell 156 mounts to the bottom of box 145 and chuck 28 is disposed within box 145. Pins 157 can be raised to a position above the upper surface of chuck 28 and lowered to a position below that surface by dual motion feedthrough 155. A wafer which is carried by tines 30 is positioned over pins 157 while they are lowered below the surface of chuck 28. Pins 157 are then raised to lift the wafer off of tines 30. Pins 157 are typically lowered after tines 30 are removed to allow the wafer to rest on the upper surface of chuck 28. At this point chuck 28 is raised by dual motion feedthrough 155 to seal with upper plate 146 and place the wafer within the plasma processing chamber. The entire process is reversed to remove the wafer from the processing chamber. Of course, in a multi-head configuration, the wafer would not be picked up by tines 30 after processing but would be picked up by tines reaching into box 145 from the adjacent shuttle plate.

Figure 9A:
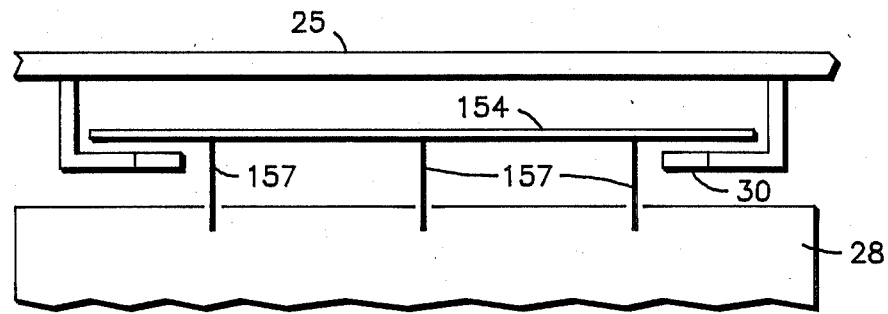
FIG. 9A is a partial cross-sectional view of the vacuum transport system of FIG. 9.

FIG. 9A is a partial cross-sectional view of the apparatus of FIG. 9 which more readily illustrates the mechanism of wafer transfer between tines 30 and pins 157. The plane of FIG. 9A is perpendicular to the direction of motion of shuttle plate 25. Tines 30 are somewhat lower than shuttle plate 25 and are supported therefrom in such a manner that a wafer 154, which has been lifted from tines 30 by pins 157, can pass between tines 30 and shuttle plate 25. In other words, shuttle plate 25 and tines 30 pass around wafer 154 when it is supported on pins 157. This feature minimizes the amount of horizontal movement of shuttle plate 25 necessary to achieve the wafer transfer.

Figure 10:
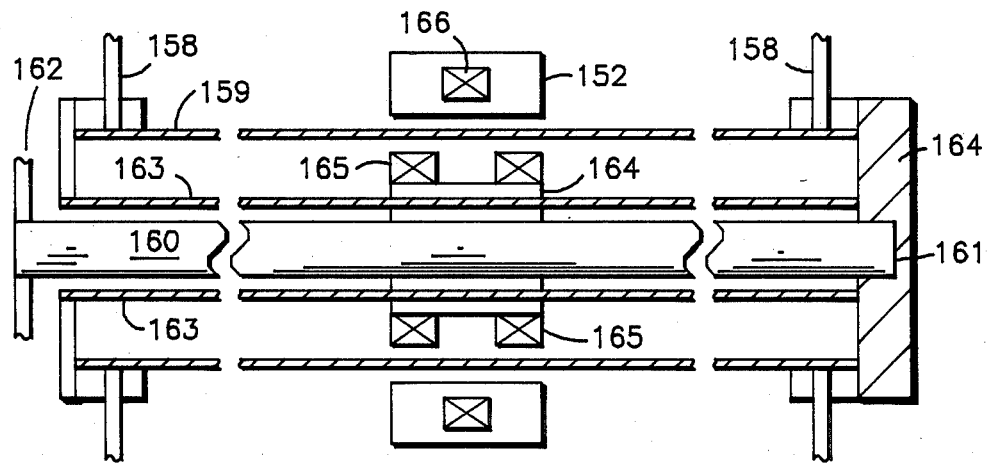
FIG. 10 is a cross-sectional view of a magnetic drive apparatus for use in a vacuum transport system such as shown in FIG. 9.

FIG. 10 is a detailed cross sectional view of a portion of the magnetic drive system 141. Walls 158 are the end walls of box 145. Tube 159 is typically a stainless steel tube which comprises one of the larger rails of the transport system. Both larger rails are of this type. Tube 159 is sealed at walls 158 to preserve the integrity of the vacuum system. Thus, the interior of tube 159 can be open to the atmosphere without interfering with the vacuum system. A lead screw 160 is coaxial with tube 159 and is mounted in a bearing 161 at one end and has a pulley 162 at the other to couple it to one of the motors 150. A pair of guide wires 163 are affixed inside tube 159 beside lead screw 160. A nut 164 is driven by lead screw 160 and guided by guide wires 163. A pair of toroidal magnets 165 are carried by nut 164. Magnets 165 are disposed at either end of nut 164. Slider 152 rides the outside of tube 159, that is inside the vacuum system, and carries a toroidal magnet 166. The fields of magnets 165 and 166 are arranged so that magnet 166 remains substantially centered between magnets 165. Thus, as lead screw 160 moves nut 164 along the length of tube 159, slider 152 is moved along the outside of tube 159. This arrangement allows the primary particle-producing portions of the drive mechanism to be located outside the vacuum containment system. This arrangement also allows motors 150 to be located outside the vacuum containment system for easy service.

Figure 11:
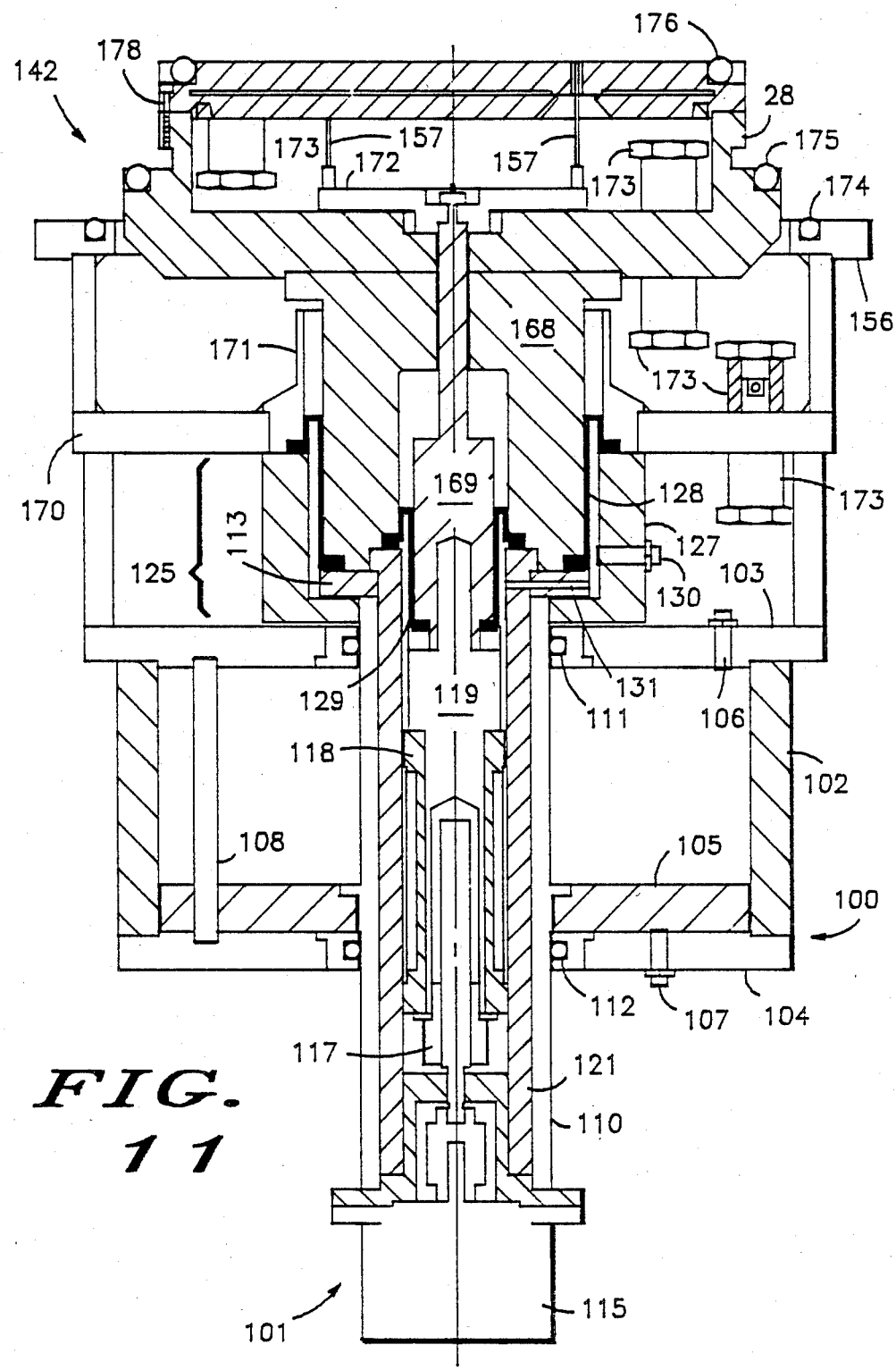
FIG. 11 is a cross-sectional view of a combined wafer stage and reactor electrode for use in a vacuum transport system such as shown in FIG. 9.

FIG. 11 is a detailed cross sectional view of dual motion feedthrough 155 and chuck 28. As is apparent from a comparison, feedthrough 155 is nearly identical to feedthrough 62 of FIG. 7. Identical reference numerals are used in the two figures to identify identical parts.

Briefly, an outer actuator 100 comprises a pneumatic cylinder 102 having end caps 103 and 104 and a piston 105. Air inlets 106 and 107 couple the pneumatic control lines to actuator 100. An outer sleeve 110 mechanically coupled to piston 105 is sealed where it passes through end caps 103 and 104 by O-rings 111 and 112, respectively. A guide pin 108 serves to keep piston 105 from cocking in cylinder 102. In this embodiment of the dual motion feedthrough, there is no stop to restrict the motion of piston 105 (see stop 109 in FIG. 7). Outer sleeve 110 is coupled through block 131 and collar 168 to chuck 28. Therefore, motion of piston 105 is translated to motion of chuck 128.

Inner actuator 101 comprises motor 115, lead screw 116, nut 117 and sliders 118, 119 and 169. Slider 169 is coupled through plate 172 to pins 157. Sliders 118, 119 and 169 slide within inner sleeve 121 which is carried with outer sleeve 110. Therefore, rotary motion of lead screw 116 driven by motor 115 is translated into vertical motion of pins 157. As is described above, pins 157 serve to transfer wafers to and from tines 30 of shuttle plate 25 and chuck 28.

A vacuum sealing apparatus 125 comprises collar 127, bottom plate 170 which is a part of sealing bell 156, outer diaphram 128, inner diaphram 129, air inlet 130 and bleed hole 131. Outer diaphram 128 and inner diaphram 129 serve to provide vacuum seal for outer actuator movement 100 and inner actuator movement 101, respectively. Air inlet 130 and bleed hole 131 serve to maintain positive pressure behind diaphrams 128 and 129, respectively.

A stop 171 which is part of sealing bell 156 serves to limit the downward movement of chuck 28 and thereby precisely determines its fully lowered position. This is necessary to effect transfer of wafers between the shuttle plate and the pins.

Vacuum sealed couplings 173 provide the necessary RF power to chuck 28. A similar set of vacuum sealed couplers which is not visible in this section provide cooling water to chuck 28.

A series of O-rings 174, 175 and 176 provides the necessary seals for chuck apparatus 142. O-ring 174 provides a seal between sealing bell 156 and vacuum containment box 145. O-ring 175 provides a seal between chuck 28 and upper plate 156 of vacuum containment 140 when chuck 28 is in its fully raised position. O-ring 176 provides a vacuum seal between electrode portion 177 of chuck 28 and the bottom of the plasma reactor apparatus which is not shown in FIG. 11. This is described in more detail with regard to FIGS. 12 and 13 below. Electrode portion 177 of chuck 28 is affixed to chuck 28 with a plurality of bolts 178 around its periphery. This allows interchangeability of electrode portion 177 to better configure chuck apparatus 142 for a particular process without substantial changes to the remainder of the system.

Figure 12:
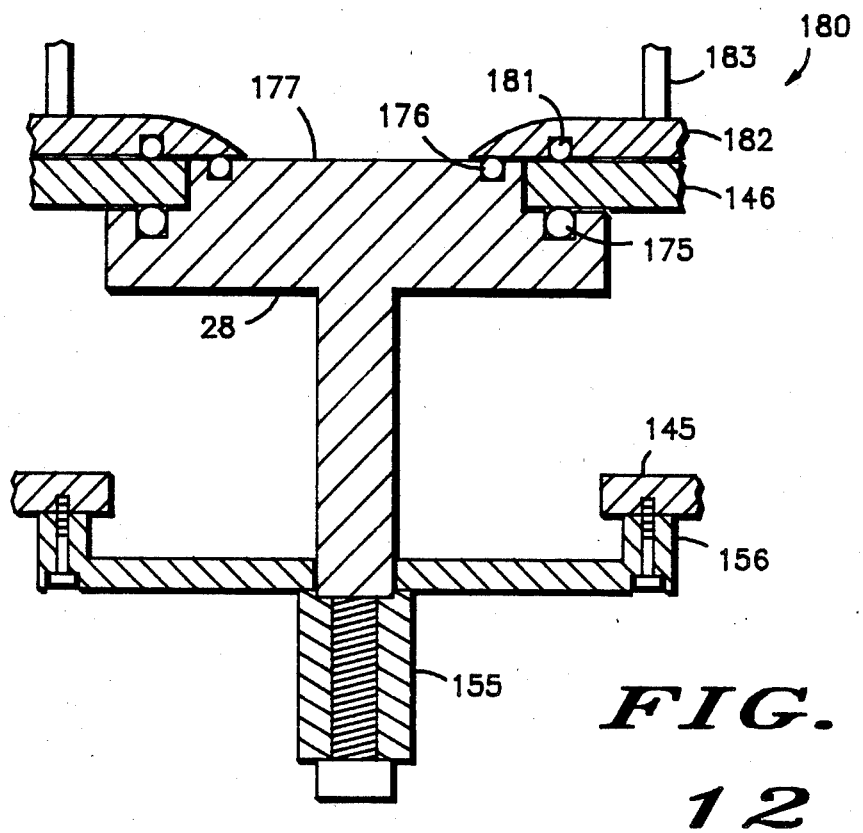
FIG. 12 is a simplified cross-sectional view of a service seal arrangement for use in a machine such as shown in FIG. 1.

FIG. 12 is a simplified cross sectional view illustrating one embodiment of the sealing arrangement between chuck 28, upper plate 146 of vacuum containment 140 and plasma chamber 180. Sealing valve 156 and dual motion feedthrough 155 provide the necessary seal for the aperture in the bottom of vacuum containment box 145 through which the chuck apparatus is passed. O-ring 175 provides a seal between chuck 28 and upper plate 146 when chuck 28 is in its fully raised position. O-ring 176 provides a seal between chuck 28 and bottom plate 182 of reactor 180. O-ring 181 provides a seal between bottom plate 182 and top plate 146.

To electrically isolate side wall portions 183 of reactor 180 from electrode portion 177 of chuck 28, bottom plate 182 is typically made of a ceramic or other insulating material. When chuck 28 is in its fully raised position as shown in FIG. 12, plasma reactor 180 may be removed from top plate 146 for servicing without disturbing the vacuum in the vacuum transport system. This allows service to reactor 180, replacement of electrode portion 177 of chuck 28 and similar measures to be undertaken without contaminating the vacuum transport system with air. O-ring 176 is necessary to prevent reactive gases in plasma reactor 180 from being drawn into the vacuum transport system during processing. O-ring 181 is necessary to preserve the vacuum in the entire system when chuck 28 is lowered for wafer transfer purposes.

Figure 13:
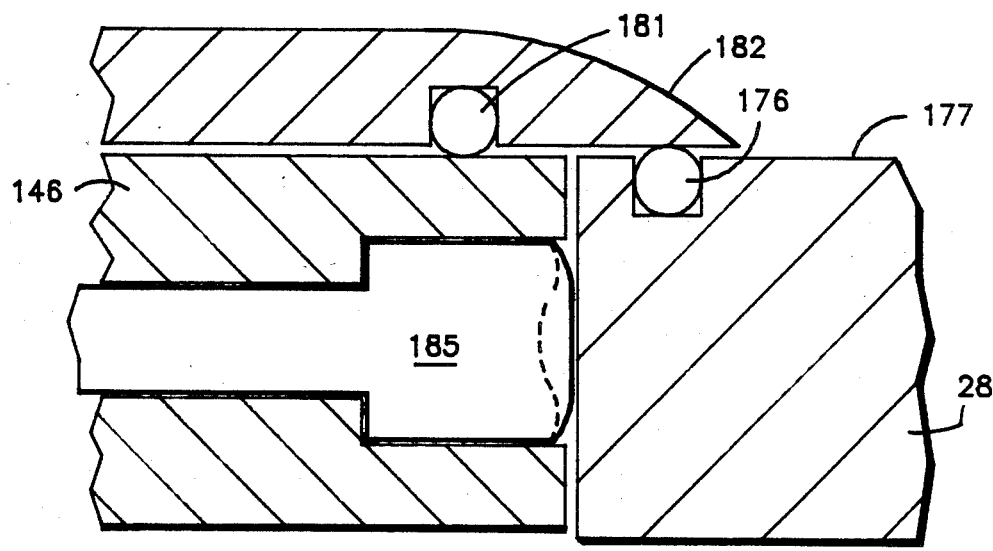
FIG. 13 is a simplified cross-sectional view on an enlarged scale of an alternate service seal arrangement.

FIG. 13 is a cross sectional view on an enlarged scale of an alternate embodiment of the service seal arrangement discussed with reference to FIG. 12. In this case, O-ring 175 and the step necessary to carry it are removed from chuck 28. An inflatable seal 185 carried in top plate 146 provides the necessary seal between plate 146 and chuck 28. O-rings 176 and 181 and electrode 177 are substantially the same as shown in FIG. 12. The primary purpose of this alternate embodiment of the service seal arrangement is to provide for a larger electrode 177 while maintaining the overall diameter of chuck 28.

We claim:

1. A method of article handling, in an article processing machine of the type having an article holding station at an input end, an article holding station at an output end and at least two chambers in which said articles are processed, comprising the steps of:
   simultaneously transferring articles from a first location to a second location in a sequence of stations defined by said input holding station, said chambers and said output holding station;
   repeating said simultaneous transfer step until each chamber holds an unprocessed article;
   simultaneously processing articles in each chamber; and
   repeating each of the above steps until all of the articles are in said output holding station.

2. A method of wafer handling, in a wafer processing machine comprising at least two processing stations arranged in sequence between an input load lock and an output load lock, comprising the steps of:
   simultaneously transferring an unprocessed wafer from said input load lock to a first processing station, from each processing station to a subsequent processing station and from a last processing station to said output load lock;
   repeating said simultaneous transfer step until each processing station holds an unprocessed wafer;
   simultaneously running a process at each of said processing stations; and
   repeating each of the above steps until all of said wafers are in said output load lock.

* * * * *